United States Patent
Würstlein et al.

(10) Patent No.: US 9,382,744 B2
(45) Date of Patent: Jul. 5, 2016

(54) METHOD FOR TESTING THE OPERATION OF AN ANTI-TRAP SYSTEM AND DIAGNOSTIC DEVICE

(71) Applicant: Brose Fahrzeugteile Gmbh & Co. Kommanditgesellschaft, Hallstadt (DE)

(72) Inventors: Holger Würstlein, Zeil am Main (DE); Christian Herrmann, Coburg (DE); Florian Pohl, Ebersdorf (DE)

(73) Assignee: Brose Fahrzeugteile Gmbh & Co. Kommanditgesellschaft, Hallstadt, Hallstadt (DE)

( * ) Notice: Subject to any disclaimer, the term of this patent is extended or adjusted under 35 U.S.C. 154(b) by 0 days.

(21) Appl. No.: 14/418,410

(22) PCT Filed: Jul. 29, 2013

(86) PCT No.: PCT/EP2013/002239
§ 371 (c)(1),
(2) Date: Jan. 29, 2015

(87) PCT Pub. No.: WO2014/019671
PCT Pub. Date: Feb. 6, 2014

(65) Prior Publication Data
US 2015/0300070 A1    Oct. 22, 2015

(30) Foreign Application Priority Data
Jul. 30, 2012  (DE) .......................... 10 2012 106 927

(51) Int. Cl.
*H03K 17/00*    (2006.01)
*E05F 15/00*    (2015.01)
(Continued)

(52) U.S. Cl.
CPC .............. *E05F 15/46* (2015.01); *H03K 17/955* (2013.01); *E05F 2015/487* (2015.01);
(Continued)

(58) Field of Classification Search
USPC .............. 701/29.1, 29.2, 29.7, 33.6; 318/255, 318/264–265; 340/545.1, 545.2, 547, 561, 340/562, 565; 307/116; 49/13, 25, 26, 31, 49/33
See application file for complete search history.

(56) References Cited

U.S. PATENT DOCUMENTS

| 4,453,112 A | 6/1984 | Sauer et al. |
| 4,458,445 A | 7/1984 | Sauer et al. |

(Continued)

FOREIGN PATENT DOCUMENTS

| CN | 101636908 A | 1/2010 |
| DE | 103 28 930 A1 | 1/2005 |

(Continued)

OTHER PUBLICATIONS

English translation of Written Opinion of the International Searching Authority for International Application No. PCT/EP2013/002239, mailed Oct. 25, 2013, 5 pages.

(Continued)

*Primary Examiner* — Yonel Beaulieu
(74) *Attorney, Agent, or Firm* — Lewis Roca Rothgerber Christie LLP

(57) ABSTRACT

A method for testing the operation of a capacitive anti-trap system for an adjustable vehicle closing element actuated by external force, such as a side door, a window, a sunroof or a tailgate, wherein a body opening of a vehicle can be locked in a closed position and that is can be moved into a closed position by a motorized drive unit. The capacitive anti-trap system is configured for detecting the trapping of an obstacle when closing the vehicle closing element by evaluating an electrical capacitance that is changed by the obstacle. The electrical capacitance, which also changes when the vehicle closing element is opened, is evaluated on the basis of at least one measured value in order to test the proper operation of the anti-trap system.

15 Claims, 7 Drawing Sheets

(51) Int. Cl.
*E05F 15/46* (2015.01)
*H03K 17/955* (2006.01)
*E05F 15/42* (2015.01)

(52) U.S. Cl.
CPC ..... *E05Y 2900/531* (2013.01); *E05Y 2900/546* (2013.01); *H03K 2217/9607* (2013.01); *H03K 2217/960705* (2013.01)

(56) References Cited

U.S. PATENT DOCUMENTS

| | | | | |
|---|---|---|---|---|
| 5,054,686 | A * | 10/1991 | Chuang | B60H 1/00735 236/1 R |
| 6,157,024 | A * | 12/2000 | Chapdelaine | G01V 13/00 250/221 |
| 6,377,009 | B1 | 4/2002 | Philipp | |
| 2004/0172879 | A1 | 9/2004 | Regnet et al. | |
| 2005/0068712 | A1 | 3/2005 | Schulz et al. | |
| 2006/0208169 | A1 * | 9/2006 | Breed | B60N 2/002 250/221 |
| 2007/0035156 | A1 | 2/2007 | Compton et al. | |
| 2007/0276567 | A1 * | 11/2007 | Schlesiger | H02H 7/0851 701/49 |
| 2007/0296242 | A1 | 12/2007 | Frommer et al. | |
| 2009/0090061 | A1 * | 4/2009 | Held | E05F 15/695 49/31 |
| 2010/0287837 | A1 | 11/2010 | Wuerstlein et al. | |
| 2015/0267454 | A1 * | 9/2015 | Wuerstlein | E05F 15/46 701/49 |

FOREIGN PATENT DOCUMENTS

| | | |
|---|---|---|
| DE | 103 10 066 B3 | 2/2005 |
| DE | 103 36 335 A1 | 3/2005 |
| DE | 20 2006 004 053 U1 | 8/2007 |
| DE | 20 2006 013 335 U1 | 2/2008 |
| DE | 20 2009 004 327 U1 | 5/2010 |
| DE | 11 2007 001 481 B4 | 9/2011 |
| EP | 0 648 628 B1 | 9/1998 |
| JP | 2001-32628 A | 2/2001 |
| WO | WO 2008/064864 A2 | 6/2008 |

OTHER PUBLICATIONS

Chinese First Office Action dated Oct. 19, 2015 for Application No. 201380040702.6 and English translation, 10 pages.
Search Report for Patent Application No. CN 2013800407026, dated Sep. 16, 2015, 2 pages.

* cited by examiner

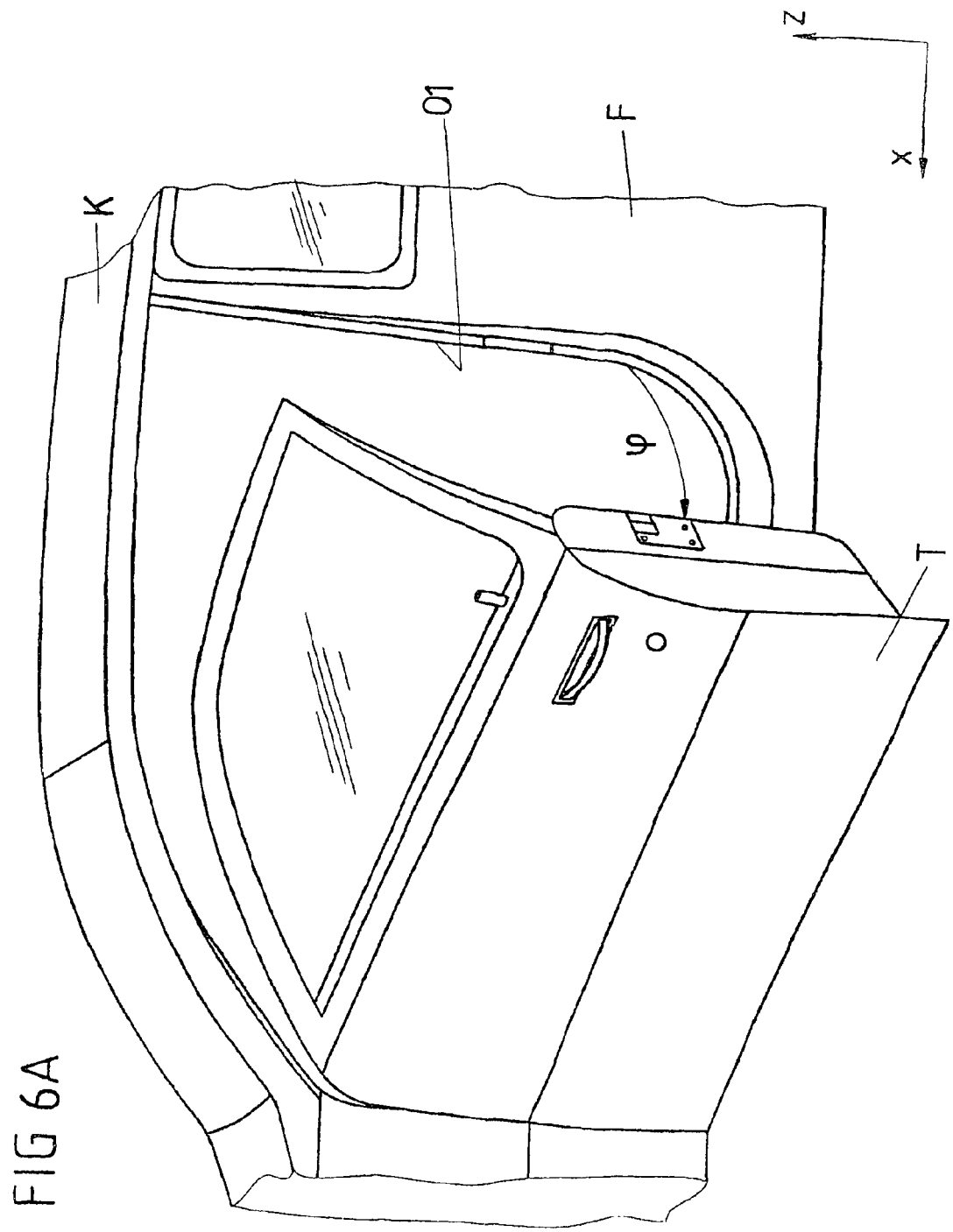

METHOD FOR TESTING THE OPERATION OF AN ANTI-TRAP SYSTEM AND DIAGNOSTIC DEVICE

CROSS-REFERENCE TO A RELATED APPLICATION

This application is a National Phase Patent Application of International Patent Application Number PCT/EP2013/002239, filed on Jul. 29, 2013, which claims priority of German Patent Application Number 10 2012 106 927.1, filed on Jul. 30, 2012.

BACKGROUND

The present invention relates to a method for testing the operation of a capacitive anti-trap system, as well as a diagnostic device by means of which the operation of a capacitive anti-trap system can be automatically tested.

Capacitive anti-trap systems are provided in the field of automobiles to detect the occurrence of an obstruction in the path of movement of the vehicle closing element during the motor-driven closing of a vehicle closing element such as a side door, tailgate, sunroof or a window, and to prevent this obstruction from being trapped. The occurrence of an obstruction is detected by changing electrical capacitance. For example in the region of the opening in the body to be closed, electrodes are provided on a vehicle structure and/or on the vehicle closing element, said electrodes generating an electrical field in the area of the opening in the body to be closed from the application of an electrical voltage. This electrical field is influenced by the hindrance located in the opening in the vehicle body which changes the electrical capacitance such that an obstacle can be detected by directly or indirectly measuring the electrical capacitance and evaluating a corresponding measuring signal in an electronic evaluation unit. Such an anti-trap protection system is for example known from EP 0 648 628 B1 in conjunction with a motor-driven motor vehicle window.

After an object is detected, normally the adjustment of the vehicle closing element is stopped and/or reversed in order to prevent an obstacle such as a body part of a person from being trapped. The operability of the anti-trap system is accordingly very important. If correct operation of the anti-trap system is not ensured, an obstacle in the adjustment path of the vehicle closing element to be closed cannot be recognized, or at least not with the required reliability, possibly with serious consequences to the health of an individual. There is therefore significant interest in being able to monitor the operability of such an anti-trap system.

In this context, DE 103 10 066 B3 proposes connecting two electrodes of a capacitive anti-trap system by means of an electronic component such as an electrical resistor and applying a test voltage to permanently monitor the operability of the electrodes. In this manner, a short circuit, for example, is immediately detected, and a warning can be output as a reaction.

The solution proposed in DE 103 10 066 B3 is disadvantageous in that a separate electronic component must also be provided, and an independent monitoring process must be implemented in an electronic evaluation unit with its own evaluation logic. Furthermore, the additional electronic component also influences the measuring of the capacitive anti-trap system since additional electronic capacitance is thereby introduced into the system. This influence of the capacitance must be accordingly be taken into account in order to be able to reliably detect the occurrence of an obstacle.

SUMMARY

Against this background, the object of the present invention is to provide an improved option for testing the operation or operability of a capacitive anti-trap system in order to overcome the cited disadvantages.

In the method as described herein, the operation of a capacitive anti-trap system by means of which the trapping of an obstacle is detected when closing a vehicle closing element is tested by evaluating an electrical capacitance that is changed by the obstacle by (electronically) evaluating the capacitance that changes upon opening the vehicle closing element on the basis of at least one measured value.

The present invention makes use of the fact that possible malfunctions of the anti-trap system can be deduced without additional electronic components since at least one measured value can be evaluated which also changes when the vehicle closing element is opened and not (just) when moving the vehicle closing element into the closed position. For example, a measured value that reflects a changing capacitance upon an obstacle and that is evaluated to identify an obstacle during the closing of the vehicle closing element also manifests a characteristic curve when opening. Deviations from of the individual values representing this characteristic (target) curve, or characteristic target curve, therefore indicate malfunctions of the anti-trap system. The anti-trap system does not have to be expanded with additional electronic components; rather, it is preferably sufficient to merely adapt the evaluation logic of an electronic evaluation unit of the anti-trap system and thereby provide, for example, an electronic diagnostic device according to the invention within an existing anti-trap system.

In order to refine the diagnostic options, one embodiment version of the embodiment provides evaluating the change over time of the measured value to assess whether there is a malfunction. The influence of the vehicle structure on the electrical field and hence on the electrical capacitance is for example accordingly reduced when the sensors or electrodes are installed on/in the vehicle closing element. Accordingly, the coupling between two electrodes of the anti-trap system is increased over the opening process. During the opening of the vehicle closing element, a measured value that is characteristic of the electrical capacitance hence changes in a specific manner when the anti-trap system is fully operational. Accordingly, a malfunction can be recognized in that the change over time of the least one measured value is compared with at least one saved target value for the change over time of the measured value for opening the vehicle closing element.

The at least one evaluated measured value for testing the operation of the anti-trap system is preferably the measured electronic capacitance. Alternatively, it is of course also possible to perform the evaluation on the basis of a measure electrical voltage or a measured current level which each equally reflect the changing capacitance in their respective curve during opening.

One development provides evaluating the at least one positionally-resolved measured value and takes into account how far the vehicle closing element is opened. In the evaluation logic of an electronic evaluation unit, there is accordingly a correlation between a detected measured value and a detected or determined position of the vehicle closing element to, for example, be able to more effectively assess whether the detected measured value in the current position of the vehicle closing element is possibly relevant, or if the measurement is necessarily incorrect.

Furthermore, it can be detected how far the vehicle closing element is open, and an evaluation can be performed as to whether the at least one measured value at a specific position of the vehicle closing element deviates from a saved target curve. An operator can therefore for example be more precisely informed of the position of the vehicle closing element at which the occurrence of an error was determined. Such a position-resolved evaluation of the at least one measured value also permits inferences about the type of any malfunctions. For example, deviations in one (first) section during the opening process are accordingly more atypical or critical than in one (subsequent second) section. For example, fluctuations in capacitance when the vehicle closing element is already largely open are more probable since contact with possible obstructions in the path of movement in this case are more likely to occur than at an early stage of the opening process. For example, it is not unusual for the distance to an obstruction to be incorrectly estimated when a tailgate is the vehicle closing element, and hence the the tailgate can be initially opened quite easily, however the tailgate contacts an obstruction such as a tree or a wall in a completely open state. The resulting influence on the electrical capacitance is in fact also reflected in the at least one measured value, but the evaluation logic of the electronic evaluation unit is configured to not assess this as a malfunction of the anti-trap system since it occurs (once) in a late or final stage of the opening movement.

With reference to the above versions of the method, tolerance ranges of different sizes can be provided over a permissible displacement range of the vehicle closing element within which a deviation from a target curve and/or a target value during the opening of the vehicle closing element can still be assessed as the proper operation of the anti-trap system. For example, the probability of noncritical influences on the generated electrical field, and the associated change in the electrical capacitance, is hence greater when the vehicle closing element is largely open than in an early stage of the opening process. Accordingly, it can for example be provided that a smaller (percentage) deviation from a set target curve is still considered permissible in an early stage or early phase during the opening of the vehicle closing element, whereas in a subsequent stage, i.e., when the vehicle closing element is open further, a larger (percentage) deviation is still tolerated as being uncritical.

In a preferred development of the method, different types of malfunctions are determined on the basis of at least one measured value. For example by comparing the curve of the at least one measured value with saved curves characteristic of the respective types of possible malfunctions, an inference can automatically be made of the type of malfunction, or at least information can be provided on which type of malfunction is most probable on the basis of the measured value curve.

In this context, in particular damage to a sensor element of the capacitive anti-trap system, a missing electrical connection of a sensor element of the anti-trap system, a loose contact in the electrical connection of the sensor element, a short circuit (to a supply voltage (Vbat) or to ground (GND) of the anti-trap system), and/or an interfering electrical, magnetic or electromagnetic field can be inferred on the basis of the at least one measured value. Hence all of the cited instances are distinguished by a characteristic curve of a measured value associated with the electrical capacitance such that information on the type of existing malfunction can be provided by an evaluation logic in an electronic evaluation unit. This information can then for example be forwarded to a user by means of a generated error signal.

The electronic evaluation unit, or a higher-level circuit arrangement, can automatically generate an error signal when an improper operation of the anti-trap system has been electronically detected on the basis of the at least one measured value. It is preferable for an error signal to only be generated when a plurality (at least two) opening cycles have been evaluated, and the at least one measured value and/or its change over time has deviated repeatedly—at least twice— from a target value and/or a target curve outside of a permissible tolerance range. This prevents any (one time) incorrect measurements from causing the generation of an error signal and possibly a corresponding message to a user; instead, an error signal is only output when an apparent error occurs repeatedly, i.e., the evaluation logic repeatedly determines a specific type of malfunction.

For further differentiation, the error signal can also only be generated when a deviation to be assessed as an error is determined over several opening cycles, basically at the same position of the motor vehicle closing element. If a deviation from a target curve or target value is repeatedly detected at same position of the motor vehicle closing element, the probability is great that a specific malfunction actually exists in this case about which a user must be informed by the generation of an error signal.

In order to limit the energy consumption from the performance of a diagnostic procedure according to the invention, and for example to limit the energy consumption from continuously detecting a measured value, one version of the method provides continuously detecting the at least one measured value during the opening of the vehicle closing element, but only detecting the least one measured value at discrete intervals when the vehicle closing element is at a standstill and at least partially open over a set period. If for example the vehicle closing element is not completely opened by a user and the vehicle closing element remains in an assumed, at least partially open position over a long period of, for example, at least 1 to 2 minutes, the measured value detected for the diagnosis is not queried and assessed permanently but rather only at discrete intervals in order to minimize a quiescent current. In this context, the term "polling" is also used.

As already mentioned at the onset, an additional aspect of the present invention is the provision of a diagnostic device which is particularly suitable for performing the operation test method according to the invention.

Such a diagnostic device is preferably part of the capacitive anti-trap system and possesses at least the following:
  a measuring unit by means of which at least one measured value is detectable of the changing electrical capacitance which also changes when the vehicle closing element is opened, and
  an evaluation unit by means of which the detected measured value is evaluated electronically during the opening of the vehicle closing element in order to test the proper operation of the anti-trap system.

When the diagnostic device is part of the anti-trap system, the provided measuring unit is for example the electrodes generating the electrical field by means of which an obstruction is also detectable and the anti-trap system is activatable.

By means of the (electronic) evaluation unit and its evaluation logic, the properoperation of the anti-trap system can preferably be tested using the detected measured value as to whether the detected measured value deviates from a target curve saved in the evaluation unit and/or at least one saved target value for the measured value, and/or whether they change over time of the measured value deviates from at least one target value saved in the evaluation unit for the change over time of the measured value.

The advantages and features described above and in the following which are associated with the method according to the invention correspondingly also apply to the diagnostic device according to the invention and vice versa.

Furthermore, it is noted that the motor-driven adjustment of a vehicle closing element is understood to be any externally-actuated adjustment, i.e., in particular adjustment by means of an electric motor, hydraulic motor and/or pneumatic motor.

BRIEF DESCRIPTION OF THE DRAWINGS

Additional advantages and features of the present invention will be clarified in the following description of exemplary embodiments on the basis of the figures.

FIG. 6A shows a section of motor vehicle with a vehicle closing element in the form of a side door.

DETAILED DESCRIPTION

Figure 6B:
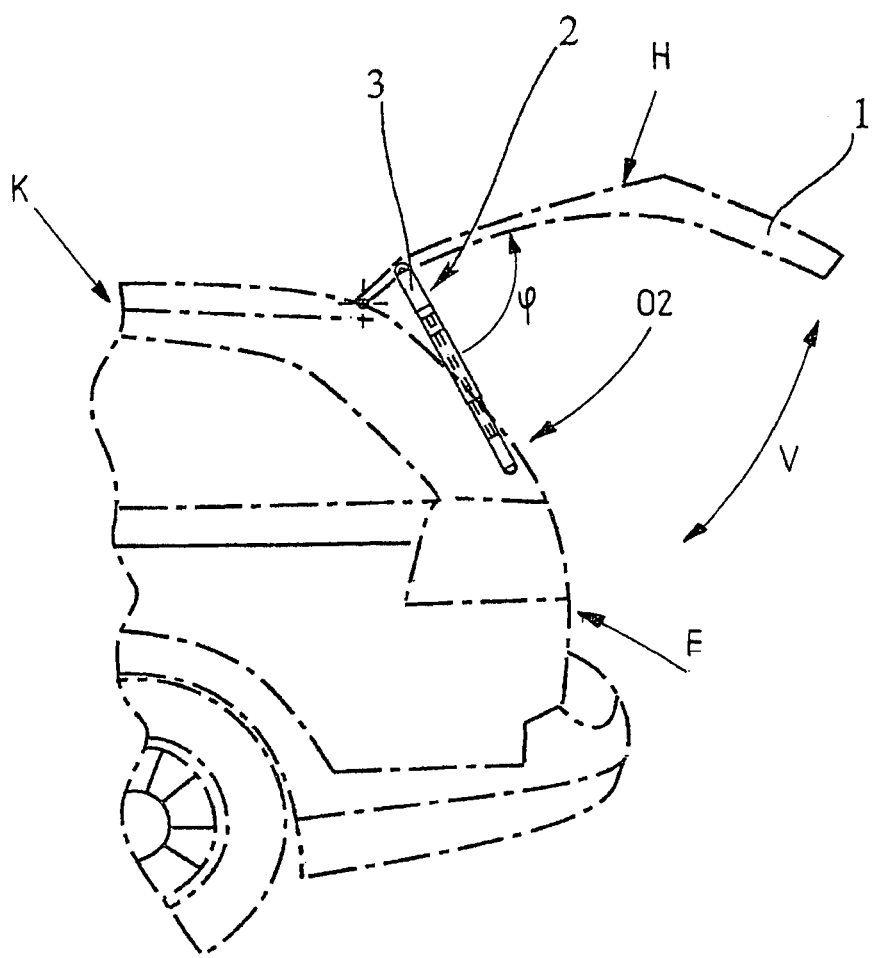
FIG. 6B shows a section of a motor vehicle with a tailgate as the vehicle closing element.

FIGS. 6A and 6B each show a section of a motor vehicle K in which a body opening O1 or O2 can be closed by means of a vehicle closing element in the form of a side door T or in the form of a tailgate H. The side door T and the tailgate H are adjustable by a motor, in this case by means of a drive 2, which is only schematically portrayed in FIG. 6B and has a drive motor 3, along an adjustment direction V into a closed position in which of the respective body opening O1, O2 is closed by the side door T or the tailgate H.

A capacitive anti-trap system is provided (not shown) to prevent an obstacle such as a body part of a person from being trapped between the closing side door T, or the closing tailgate H, and a vehicle structure F having the body opening O1, O2 during the motor-driven transfer into the closed position. This anti-trap system operates with sensor elements, for example in the form of electrodes spaced from each other on the respective vehicle closing element T, H which generate an electrical field, and by means of which an obstacle in the adjustment path of the vehicle closing element T, H to be closed can therefore be detected contact-free by means of changing electrical capacitance.

In the case of the tailgate H, two electrodes are placed in each case on a longitudinal side of the tailgate on or in a tailgate edge in order to detect any obstacle in the area of the body opening O2 at the rear of the motor vehicle K between the tailgate H and the vehicle structure F bounding the body opening O2. If an obstacle is detected by the evaluation logic of the electronic evaluation unit of the anti-trap system on the basis of at least one measured value representing the electrical capacitance, the adjusting movement to the side door T or tailgate H is stopped and, if applicable, reversed.

In order to be able to very easily test if the anti-trap system is fully operational and be able to properly detect the presence of an obstacle when the respective vehicle closing element T, H is closed, it is proposed according to the invention to evaluate the electrical capacitance which also changes during the opening of the vehicle closing element. The electrical capacitance accordingly changes when opening the side door T or the tailgate H due to the decreasing influence of the vehicle structure F as the side door T or tailgate H is increasingly opened. It has already been noted that a method according to the invention can also be used for an anti-trap system for a window or sunroof.

In the present case, the electrical capacitance C is measured directly to infer a possible impairment or malfunction of the anti-trap system arising from any deviations from a set target curve $C_{Soll}(t)$ (or $C_{Soll}(\phi)$), from a target value $C_{max}$ when the side door T is open or when the tailgate H is open, and from a target value for the change over time of the capacitance $\dot{C}_{Soll}=dC(t)/dt$. The proper operation of the anti-trap system hence occurs without additional electronic components and, in the present version of the embodiment, preferably also only on the basis of the measured value that is also evaluated to detect an obstacle.

In FIGS. 1A, 2A, 3A, 4A and 5A, an opening angle $\phi$ is plotted over time t to illustrate the opening process. This opening angle $\phi$ can be seen in FIGS. 6A and 6B and designates the resulting angle between the opened side door T, or the opened tailgate H, and the fixed vehicle structure F. An angle $\phi=0°$ stands for a completely closed side door T or a completely closed tailgate H.

Figure 1A:
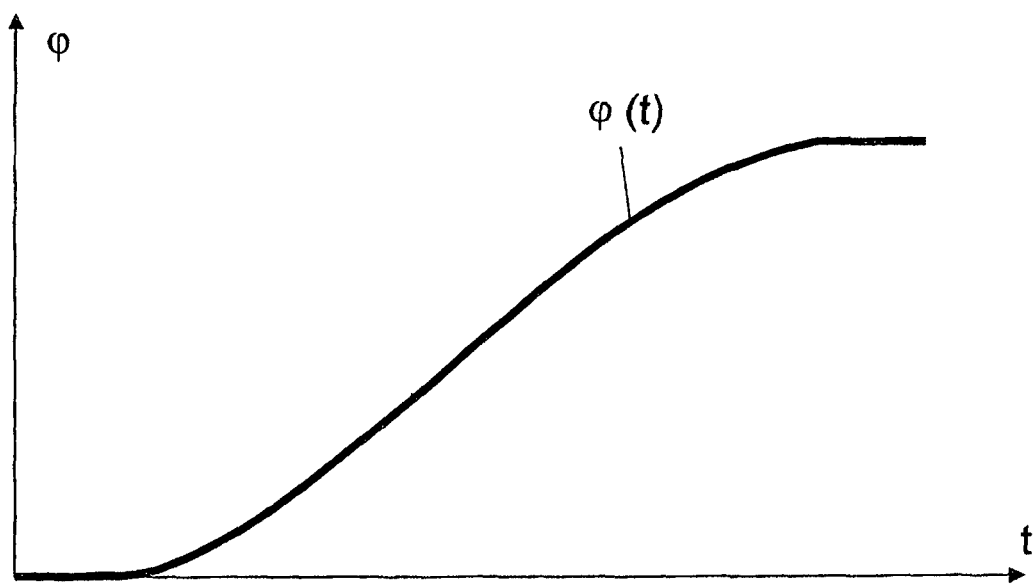
FIG. 1A shows a diagram in which the opening angle of a tailgate is plotted over time with reference to the fixed vehicle structure.
Figure 1B:
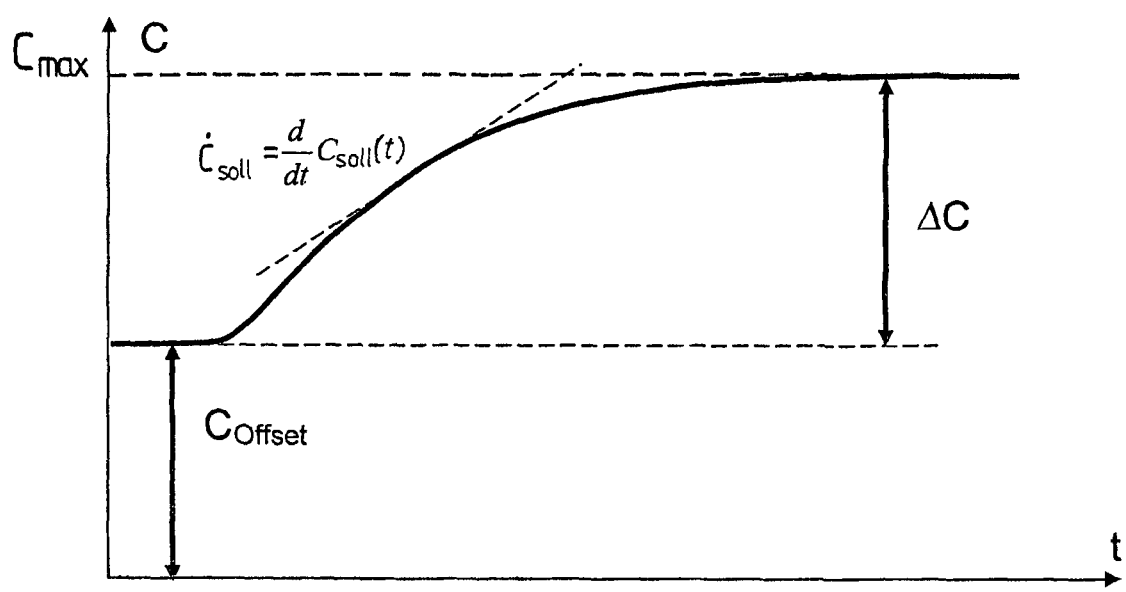
FIG. 1B shows a diagram in which a measured electrical capacitance is plotted over time during the opening of the tailgate and depicts a target curve of the capacitance when the anti-trap system operates properly.

The diagram in FIG. 1B shows a target curve $C_{Soll}(t)$ for the measured electrical capacitance C over time t as the side door T or the tailgate H is opened when the anti-trap system is operating properly. Starting from an offset value $C_{Offset}$, the capacitance C changes by $\Delta C$ with a characteristic slope $\dot{C}_{Soll}$ up to a maximum capacitance $C_{max}$. If the measured capacitance deviates from this characteristic target curve, a malfunction or disturbance of the anti-trap system can be inferred such that it may no longer correctly identify an arising obstacle during subsequent closing of the side door T or tailgate H.

FIGS. 2B, 3B, 4B and 5B show different measured value curves $C_1(t)$, $C_2(t)$, $C_3(t)$ and $C_4(t)$ in which different types of malfunctions can be seen that are accordingly evaluated by an evaluation logic of an electronic evaluation unit (of the anti-trap system), and are evaluated to generate one or several error signals.

Figure 2A:
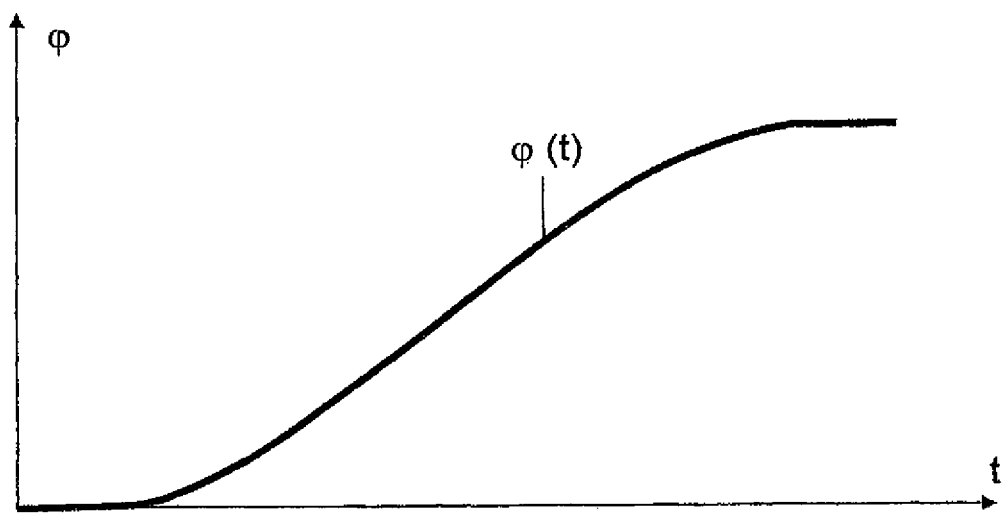
FIGS. 2A-2B shows the opening angle/time diagram from FIG. 1A and a capacitance/diagram with a measured capacitance curve when there is a malfunction of the anti-trap system of a first type.
Figure 2B:
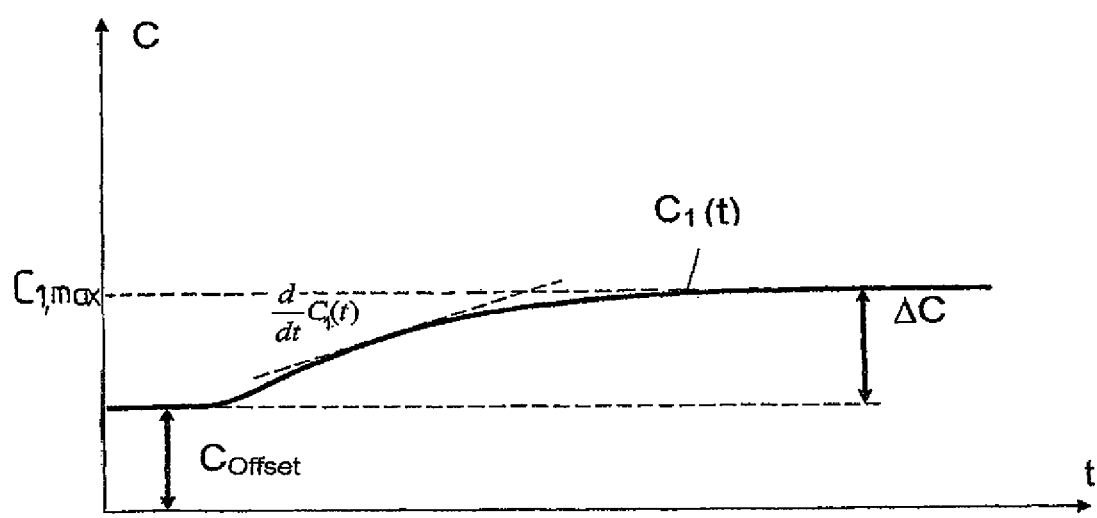

FIG. 2B with the capacitance curve for measured value curve $C_1(t)$ shows that the measured capacitance C does not reach the set target maximum value $C_{max}$ when the opening process is finished. Instead, only a maximum value $C_{1,max}$ is reached that is less by several times than the saved target maximum value $C_{max}$. Furthermore, the capacitance C rises less strongly during the opening process; the time derivation $dC_1(t)/dt$ value is hence less than the time derivation $\dot{C}_{Soll}$. On the basis of these two criteria, it can therefore be inferred that a connected sensor element of the anti-trap system is damaged in/on the side door T or the tailgate H. Such a curve of the capacitance C is hence characteristic of a partially torn-off sensor electrode in a capacitive anti-trap system.

Figure 3A:
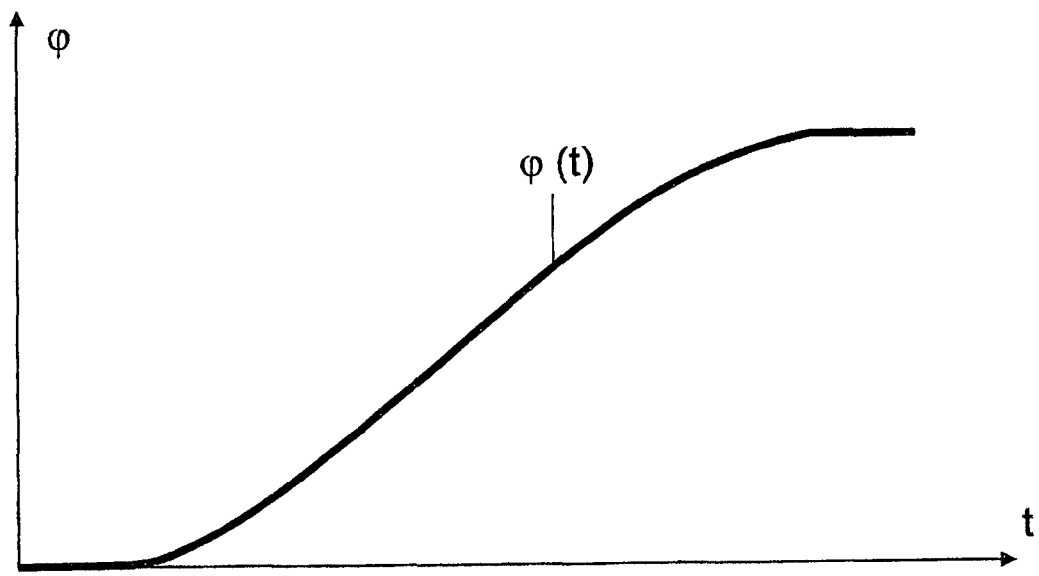
FIGS. 3A-3B shows the opening angle/time diagram from FIG. 1A and a capacitance/time diagram with a measured capacitance curve when there is a malfunction of the anti-trap system of a second type.
Figure 3B:
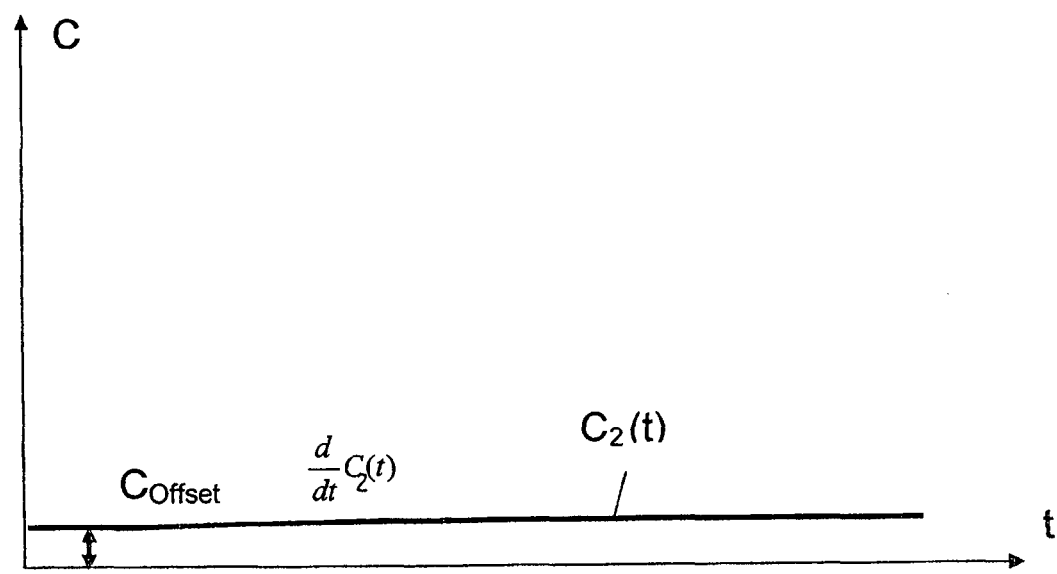

In the measured capacitance curve $C_2(t)$ in FIG. 3B, the measured capacitance C scarcely changes at all during the opening process; the time derivative $dC_2(t)/dt$ is hence nearly 0 during the entire opening process. Such a measurement indicates that the electrical connection of a sensor element of the anti-trap system is completely missing. Such a curve is hence characteristic for example of unplugged electrodes of the capacitive anti-trap system.

Figure 4A:
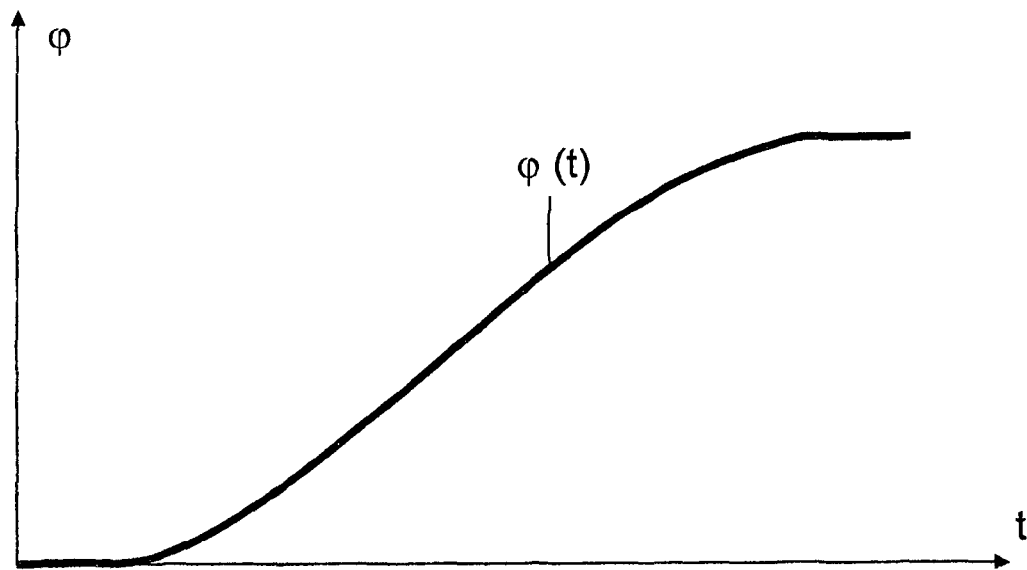
FIGS. 4A-4B shows the opening angle/time diagram from FIG. 1A and a capacitance/time diagram with a measured capacitance curve when there is a malfunction of the anti-trap system of a third type.
Figure 4B:
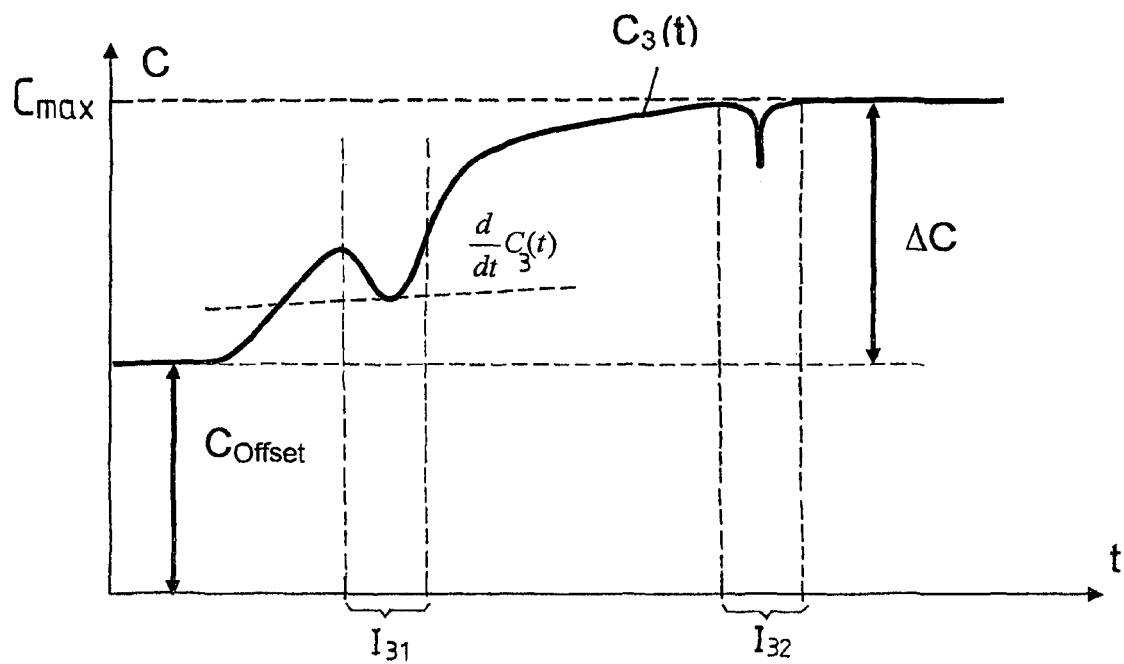

The diagram of FIG. 4B shows a capacitance curve $C_3(t)$ in which, after the opening process to be evaluated is concluded, the target maximum value $C_{max}$ is reached, whereas the opening process within the two interference intervals I31 and I32 of the measured capacitance curve $C_3(t)$ differ significantly from the saved target curve $C_{Soll}(t)$. In this case, the measured capacitance in the interference intervals $I_{31}$, $I_{32}$ decreases in each case, and the time derivation $dC_3(t)/dt$ is initially negative and finally equal to 0 (identifiable in the graph at an inflection point in the measured value curve ($C_3(t)$). Such a fluctuation in the measured capacitance C in the first interference interval $I_{31}$ suggests a loose contact in the electrical connection of a sensor element of the anti-trap system. The decrease in capacitance which is much shorter and occurs suddenly in the second interference interval $I_{32}$ is contrastingly characteristic of the contact of the respective vehicle closing element T, H with an obstacle. This deviation is therefore not (immediately) assessed by the evaluation logic as a malfunction in the capacitive anti-trap system.

Figure 5A:
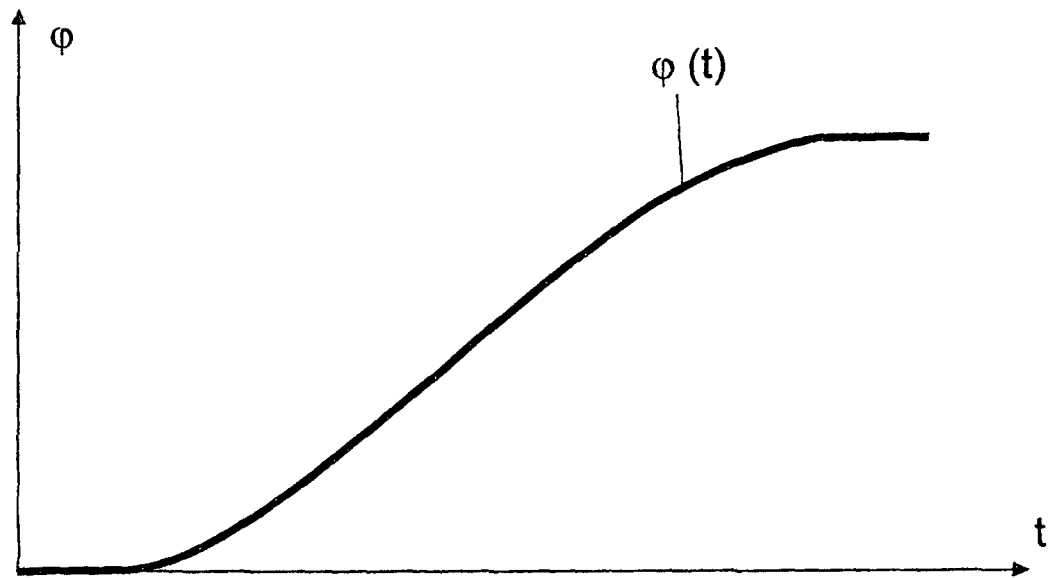
FIGS. 5A-5B shows the opening angle/time diagram from FIG. 1A and a capacitance/time diagram with a measured capacitance curve when there is a malfunction of the anti-trap system of a fourth type
Figure 5B:
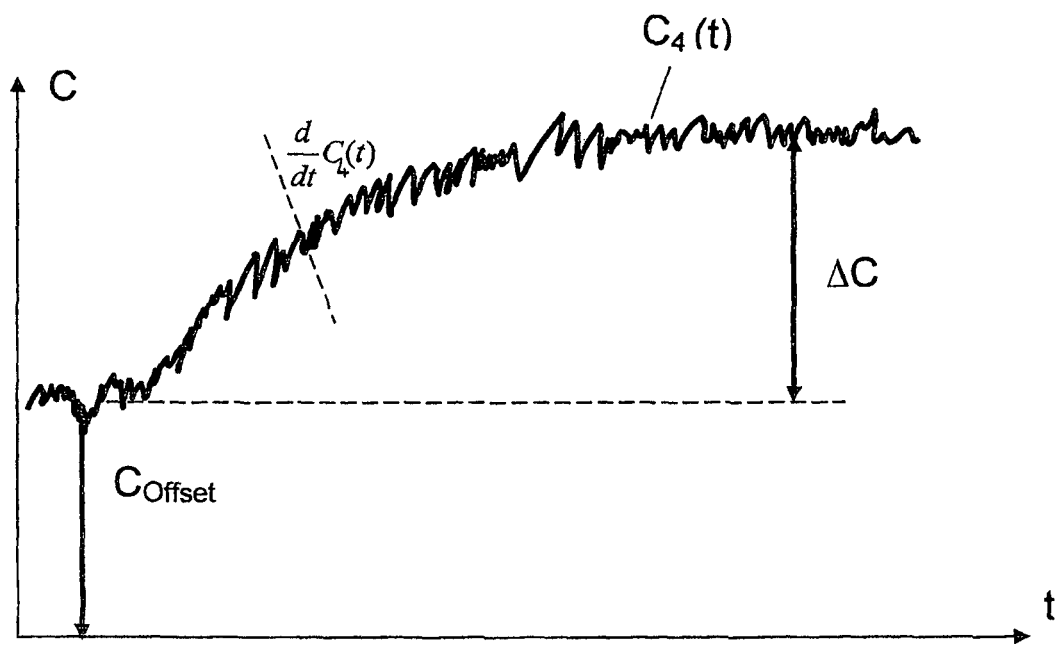

In the diagram in FIG. 5B, the measured capacitance curve $C_4(t)$ shows strong fluctuations and possibly discontinuities as well during the entire opening process. Experience shows that such a curve is characteristic of interference from other electronic components and electrical, magnetic and/or electromagnetic fields generated thereby. In this case, the evaluation logic initially infers for example an error if such a measured value curve is measured repeatedly over several opening cycles, and an ongoing influence which may impair the operability of the anti-trap system must therefore be assumed, and it is no longer certain that the capacitive obstacle identification works properly.

Preferably, especially the four depicted measured value curves $C_1(t)$ to $C_4(t)$ are saved in the evaluation logic of the electronic evaluation unit in addition to the target value curve $C_{Soll}(t)$ and the target value for the time derivative $\dot{C}_{Soll}$ such that the evaluation logic is configured and intended to classify different malfunctions on the basis of each measured curve, and subsequently always generates adapted error or malfunction messages.

It is furthermore preferable when the evaluation logic also include the current position of the respective vehicle closing element T, H, in this case for example the current opening angle φ, in the evaluation of whether a malfunction or interference actually exists. Consequently, a position-resolved measured value is evaluated in this case, for example a measured capacitance value C(φ).

In a development based on the above, the position-resolved evaluation can be used to compare at least two (recently) detected measured values with each other, a first measured value being representative of a changing capacitance at the first longitudinal vehicle side, and a second measured value being representative of a changing electrical capacitance on the other longitudinal vehicle side. For example, two measured values for each of the two longitudinal sides of the same vehicle closing element, or two measured values for two vehicle closing elements on different longitudinal vehicle sides, can be compared with each other resolved by the position.

For example in a tailgate H, the anti-trap system can have two sensor arrangements at a distance from each other on the longitudinal sides of a tailgate H by means of which the trapping of an obstacle can be independently detected on the respective longitudinal right or left closing edge of tailgate H. If the two sensor arrangements are designed symmetrical with each other, nearly the same measured values are detected when the anti-trap system operates properly as the tailgate H is opened. By comparing the two measured values during the opening of the tailgate, it can accordingly be determined if deviating measured values are being supplied by one of the sensor arrangements, such that a malfunction of the anti-trap system, for example from damage to the respective sensor arrangement, should be assumed.

In another version, the anti-trap system can compare a first measured value representative of a changing capacity when a vehicle closing element is opened on a longitudinal vehicle side, with a second measured value that was detected when opening another vehicle closing element on the other longitudinal vehicle side at the same position or same opening angle. For example, the curve of a measured value measured over the opening angle of a right side door can be compared with the measured value curve for a left side door. If the individual measured values each assigned to a specific opening angle differ from each other (beyond the permissible tolerance range), there is apparently a malfunction of the anti-trap system in one of the side doors.

The electronic diagnostic device configured to perform the diagnostic method which assesses the continuously or discreetly detected measured values and especially tests whether they deviate from the saved target curve or values in an impermissible manner and compares them with the saved curves for different types of malfunctions, is advantageously part of the anti-trap system.

It is, however, of course alternately possible to provide a separate diagnostic device that, when the respective vehicle closing system T, H is opened on the basis of the measured values provided by the anti-trap system, performs a test of whether the anti-trap system is (still) fully operational.

LIST OF REFERENCE NUMBERS

1 Tailgate edge
2 Drive unit
3 Drive motor
C Capacitance
$C_1(t)$, $C_2(t)$, $C_3(t)$, $C_4(t)$ Measured value/measured value curve
$C_{max}$, $C_{1,max}$ Maximum value
$C_{Offset}$ Offset value
$\dot{C}_{Soll}$ Target value of the time derivative
$C_{Soll}(t)$ Target value curve
F Vehicle structure
H Tailgate
$I_{31}$, $I_{32}$ Interference interval
K Motor vehicle
O1, O2 Body opening
T Side door
t Time
V Adjustment direction
φ Opening angle

The invention claimed is:

1. A method for testing operation of a capacitive anti-trap system for an adjustable vehicle closing element configured to be actuated by external force and by which a body opening of a vehicle can be locked in a closed position, wherein the closing element can be moved into the closed position by a motorized drive unit, the method comprising:
obtaining an electrical capacitance during opening or closing of the closing element; and
evaluating the electrical capacitance using the capacitive anti-trap system such that the trapping of an obstacle is detectable during the opening or closing of the closing element, wherein the evaluating comprises:
obtaining at least one measured value of the electrical capacitance for the opening or closing of the closing element;
saving at least one of a target curve and a target value for the at least one measured value; and
comparing the at least one measured value to the saved target curve or the saved target value and concluding a malfunction of the anti-trap system when the at least one measured value deviates from the saved target curve or the saved target value.

2. The testing method according to claim 1, wherein the at least one measured value comprises a measured capacitance, a measured electrical voltage or a measured current strength.

3. The method according to claim 1, wherein a change over time of the at least one measured value is evaluated for an assessment of whether there is a malfunction.

4. The method according to claim 3, wherein to assess whether there is a malfunction, the change over time of the at least one measured value is compared with at least one saved target value for the change over time of the at least one measured value.

5. A method for testing operation of a capacitive anti-trap system for an adjustable vehicle closing element configured to be actuated by external force and by which a body opening of a vehicle can be locked in a closed position, wherein the closing element can be moved into the closed position by a motorized drive unit, the method comprising:
obtaining an electrical capacitance during opening or closing of the closing element; and
evaluating the electrical capacitance using the capacitive anti-trap system such that the trapping of an obstacle is detectable during opening or closing of the closing element, wherein the evaluating comprises:
obtaining at least one measured value of the electrical capacitance for the opening or closing of the closing element; and
performing at least one of (a) and (b) as follows:
(a) obtaining a first measured value being representative of a changing capacitance at a first longitudinal vehicle side, obtaining a second measured value being representative of a changing capacitance at a second longitudinal vehicle side, and comparing the first and second measured values with each other during the opening or closing of the closing element to evaluate whether the anti-trap system is operating properly; and
(b) registering how far the closing element is opened or closed as the at least one measured value and determining whether the at least one measured value deviates from a saved target curve to evaluate whether the anti-trap system is operating properly.

6. The method according to claim 1, wherein evaluation of the at least one measured value is positionally resolved and takes into account how far the vehicle closing element is opened, the method further comprising providing tolerance ranges of different sizes over a permissible displacement range of the vehicle closing element within which a deviation from a target curve and/or a target value during the opening of the vehicle closing element can be assessed as proper operation of the anti-trap system.

7. A method for testing operation of a capacitive anti-trap system for an adjustable vehicle closing element configured to be actuated by external force and by which a body opening of a vehicle can be locked in a closed position, wherein the closing element can be moved into the closed position by a motorized drive unit, the method comprising:
obtaining an electrical capacitance during opening or closing of the closing element; and
evaluating the electrical capacitance using the capacitive anti-trap system such that the trapping of an obstacle is detectable during opening or closing of the closing element, wherein the evaluating comprises:
obtaining at least one measured value of the electrical capacitance for the opening or closing of the closing element; and
performing at least one of (a) or (b) as follows:
(a) determining different types of malfunctions based on the at least one measured value including damage to a sensor element of the capacitive anti-trap system, a missing electrical connection of a sensor element of the anti-trap system, a loose contact in the electrical connection of a sensor element, a short circuit, and an interfering electrical, magnetic or electromagnetic field; and
(b) determining different types of malfunctions based on the at least one measured value during the opening of the closing element and comparing the time curve of the at least one measured value with saved curves of a respective malfunction to determine which type of malfunction exists.

8. The method according to claim 1, further comprising automatically generating an error signal when an improper operation of the anti-trap system has been electronically detected on the basis of the at least one measured value.

9. A method for testing operation of a capacitive anti-trap system for an adjustable vehicle closing element configured to be actuated by external force and by which a body opening of a vehicle can be locked in a closed position, wherein the closing element can be moved into the closed position by a motorized drive unit, the method comprising:
obtaining an electrical capacitance during opening or closing of the closing element; and
evaluating the electrical capacitance using the capacitive anti-trap system such that the trapping of an obstacle is detectable during opening or closing of the closing element, wherein the evaluating comprises:
obtaining at least one measured value of the electrical capacitance for the opening or closing of the closing element;
evaluating a plurality of opening cycles on the basis of the at least one measured value, and
generating an error signal only when the at least one measured value or its change over time deviates beyond a permissible tolerance range at least twice from a target value and a target curve, in particular basically at the same position of the motor vehicle closing element.

10. A method for testing operation of a capacitive anti-trap system for an adjustable vehicle closing element configured to be actuated by external force and by which a body opening of a vehicle can be locked in a closed position, wherein the closing element can be moved into the closed position by a motorized drive unit, the method comprising:

obtaining an electrical capacitance during opening or closing of the closing element; and evaluating the electrical capacitance using the capacitive anti-trap system such that the trapping of an obstacle is detectable during opening or closing of the closing element, wherein the evaluating comprises:

obtaining at least one measured value of the electrical capacitance for the opening or closing of the closing element, wherein the at least one measured value is detected continuously during the opening of the vehicle closing element, but wherein the at least one measured value is detected only at discrete intervals when the vehicle closing element is at a standstill and is at least partially opened over a set period.

11. A diagnostic device for testing the operation of a capacitive anti-trap system for an adjustable vehicle closing element configured to be actuated by external force, the vehicle closing element being configured to lock a body opening of a vehicle in a closed position and configured to be moved into the closed position by a motorized drive unit, wherein the capacitive anti-trap system is configured to detect the trapping of an obstacle when opening or closing the vehicle closing element by evaluating an electrical capacitance that is changed by the obstacle, wherein the diagnostic device comprises:

a measuring unit configured to detect at least one measured value of the changing electrical capacitance, and an evaluation unit configured to:

electronically evaluate the detected at least one measured value during the opening or closing of the vehicle closing element by comparing the detected at least one measured value against at least one of a saved target curve and a saved target value; and conclude a malfunction of the anti-trap system when the at least one measured value deviates from the saved target curve or the saved target value.

12. The method according to claim 1 further comprising:

registering how far the vehicle closing element is opened; and evaluating whether the at least one measured value at a specific position of the vehicle closing element deviates from the saved target curve, or the saved target value by more than a permissible displacement range of the vehicle closing element from the saved target curve or saved target value to assess whether the anti-trap system is operating properly.

13. The method according to claim 9, wherein an error signal is only generated when the at least one measured value and its change over time deviate at least twice from at least one of the target value and the target curve beyond a permissible tolerance range.

14. The method according to claim 9, wherein an error signal is only generated when the at least one measured value or its change over time deviates at least twice basically at the same position of the motor vehicle closing element from at least one of a target value and the target curve beyond a permissible tolerance range.

15. The method according to claim 13, wherein an error signal is only generated when the at least one measured value and its change over time deviate at least twice basically at the same position of the motor vehicle closing element from at least one of the target value and the target curve beyond a permissible tolerance range.

* * * * *